United States Patent
Kang et al.

(10) Patent No.: US 6,737,492 B2
(45) Date of Patent: May 18, 2004

(54) RADIATION ABSORBING POLYMER, COMPOSITION FOR RADIATION ABSORBING COATING, RADIATION ABSORBING COATING AND APPLICATION THEREOF AS ANTI-REFLECTIVE COATING

(75) Inventors: Wen-Bing Kang, Shizuoka (JP); Munirathna Padmanaban, Somerville, NJ (US); Hatsuyuki Tanaka, Shizuoka (JP); Ken Kimura, Shizuoka (JP); Takanori Kudo, Shizuoka (JP); Georg Pawlowski, Shizuoka (JP)

(73) Assignee: Clariant Finance (BVI) Limited (VG)

( * ) Notice: Subject to any disclaimer, the term of this patent is extended or adjusted under 35 U.S.C. 154(b) by 86 days.

(21) Appl. No.: 10/229,219

(22) Filed: Aug. 27, 2002

(65) Prior Publication Data

US 2003/0065119 A1 Apr. 3, 2003

Related U.S. Application Data

(62) Division of application No. 09/244,358, filed as application No. PCT/JP98/02333 on May 27, 1998, now Pat. No. 6,468,718.

(30) Foreign Application Priority Data

Jun. 4, 1997 (JP) .............................. 9-146800
May 27, 1998 (JP) ................................. PCT/JP98/02333

(51) Int. Cl.$^7$ .............................................. C08F 116/36
(52) U.S. Cl. ................... 526/316; 526/326; 526/329.5
(58) Field of Search ............................. 526/329.5, 316, 526/326

(56) References Cited

U.S. PATENT DOCUMENTS

| | | | |
|---|---|---|---|
| 4,677,155 A | 6/1987 | Finter | 524/781 |
| 4,797,347 A | 1/1989 | Finter | 430/311 |
| 4,910,122 A | 3/1990 | Arnold et al. | 430/313 |
| 5,057,399 A | 10/1991 | Flaim et al. | 430/313 |
| 5,294,680 A | 3/1994 | Knors et al. | 525/327.4 |
| 5,525,457 A | 6/1996 | Nemoto et al. | 430/325 |
| 5,677,112 A | 10/1997 | Urano et al. | |

FOREIGN PATENT DOCUMENTS

WO    WO 94/12912    6/1994

OTHER PUBLICATIONS

English abstract for JP 49–039687, Apr. 13, 1974.
English abstract for JP 53–107835, Sep. 20, 1978.
English abstract for JP 58–103512, Jun. 20, 1983, (see AA & AB Above).
English abstract for JP 5–034647, Feb. 12, 1993.
English abstract for JP 06–075378, Mar. 18, 1994, (see AE Above).
English abstract for JP 6–118656, Apr. 28, 1994, (see AF above).
English abstract for JP 7–126536, May 16, 1995.
English abstract for JP 10–090908, Apr. 10, 1998.

*Primary Examiner*—Bernard Lipman
(74) *Attorney, Agent, or Firm*—Alan P. Kass

(57) ABSTRACT

A radiation absorbing polymer having chemically bonded thereto a radiation absorbing dye, which has high absorption at a predetermined wavelength radiation, which shows good adhesion to a substrate and good thin film-forming, which has no dependence upon resists, which is soluble in a solvent for photoresists but becomes insoluble after being baked; a composition for radiation absorbing coating containing this polymer, and a radiation absorbing coating such as an anti-reflective coating formed from this composition are disclosed. The radiation absorbing polymer comprises a copolymer containing at least both a recurring unit composed of a monomer containing a keto group and a divalent group (preferably a methylene group) in its side chain and a recurring unit composed of a monomer containing an organic chromophore bonded directly or through a linkage group to the main chain. This radiation absorbing polymer is dissolved in a solvent such as alcohol, aromatic hydrocarbon, ketone, ester, etc., and the resulting solution is applied to a wafer and baked to form a radiation absorbing coating such as an anti-reflective coating. On this coating is coated, for example, a chemically amplified resist. This coated substrate is then exposed to deep UV rays and is developed to form a fine resist pattern excluding the influence of standing wave.

15 Claims, No Drawings

RADIATION ABSORBING POLYMER, COMPOSITION FOR RADIATION ABSORBING COATING, RADIATION ABSORBING COATING AND APPLICATION THEREOF AS ANTI-REFLECTIVE COATING

This Application is a divisional of application Ser. No. 09/244,358, U.S. Pat. No. 6,468,718, filed Feb. 4, 1999.

TECHNICAL FIELD

This invention relates to a radiation absorbing polymer which has chemically bonded thereto an organic chromophore, a coating composition containing the radiation absorbing polymer and an anti-reflective coating formed from the coating composition and, more particularly, to a radiation absorbing polymer capable of forming a radiation absorbing coating such as an anti-reflective coating useful in manufacturing integrated circuit elements by lithography, a composition containing the radiation absorbing polymer, and a radiation absorbing coating such as an anti-reflective coating formed from the composition.

BACKGROUND ART

In the field of manufacturing integrated circuit elements, patterning technology to form finer patterns by lithographic process has made progress and, in recent years, in order to attain a higher degree of integration, the development of patterning technology enabling quarter micron fine patterning has been studied. In such a lithographic process, a photoresist is applied to a substrate, a latent image of a mask pattern is created in the photoresist using a reduction projection exposure apparatus, then the latent image is developed using a proper developer solution to obtain a patterned resist with the desired width and pattern. However, many substrates used in the field of manufacturing integrated circuit elements have such a high reflectivity that, upon exposure, exposing light passing through the photoresist layer is reflected on the surface of the substrates and is again incident into the photoresist layer, which causes the problem that desired patterns are not obtained or that patterns with some defects are formed due to exposure by the reflected light of photoresist areas which are not to be exposed. These are called problems of standing wave or notching. Various techniques have been investigated to solve the problems caused by such reflection. For example, there have been attempted a technique of dispersing a dye having radiation absorption at the same exposure wavelength as in the photoresist, a technique of forming a radiation absorbing coating of an inorganic compound such as titanium nitride according to a CVD method, vacuum evaporation method or the like, a technique of forming a radiation absorbing coating by applying a dispersion or solution of a radiation absorbing dye in an organic polymer solution on to a substrate, and a technique of forming a radiation absorbing coating by applying to a substrate a radiation absorbing polymer having chemically bonded thereto a chromophore. Of the above-described techniques, the technique of dispersing a radiation absorbing dye in a photoresist has the problems of reduction in photoresist sensitivity, thinning of the resist layer during development processing, sublimation of the dye upon baking, and the like. The technique of using an inorganic anti-reflective coating has the various problems of difficulty in accurate control of coating thickness, difficulty of forming a coating with uniform coating thickness, requirement for a special apparatus for conducting, vapor deposition, poor adhesion with a resist film, a requirement for separately providing a step of transferring a pattern by dry etching, and the like. Further, the technique of dispersing a radiation absorbing dye in the anti-reflective coating involves the problems of separation of the polymer and the dye from each other upon formation of the anti-reflective coating by spin-coating, elution of the dye into a resist solvent, sublimation of the dye into the resist layer upon baking, and the like. On the other hand, the technique of using a radiation absorbing polymer does not involve such problems, and hence this technique has been noted in recent years. Methods of using radiation absorbing polymers as anti-reflective coatings and materials to be used for the methods are described in, for example, Japanese Laid-open Patent Publication Nos. H6-75378 and H6-118656, WO 9412912, U.S. Pat. Nos. 4,910,122 and 5,057,399, etc. Of the radiation absorbing polymers, those polymers wherein a radiation absorbing chromophore is chemically bonded to the polymer skeleton have recently been considered most promising, and methods of using them and their application, have already been studied. Particularly in the process of using radiation having a wavelength not longer than that of an eximer laser, an anti-reflective coating is considered to be necessary, and it has been desired to provide an anti-reflective coating having good properties.

On the other hand, there exists a requirement that, upon formation of a photoresist coating on a substrate having a large unevenness, an undercoating layer or an intermediate layer is first coated on the substrate to make the surface even for forming a resist image with high dimensional accuracy. Investigation for meeting such a requirement is also necessary.

Formation of resist patterns using a radiation absorbing intermediate coating such as an anti-reflective coating between a photoresist layer and a substrate before forming a resist pattern is conducted as follows. That is, a composition for a radiation absorbing coating such as an anti-reflective coating solution is first coated to a substrate and, after baking the coating to be made insoluble in a resist solvent, the resist coating is formed by a coating method on the radiation absorbing coating, such as the anti-reflective coating, and is then subjected to the processes of exposure, development processing, etc. to form a resist pattern, followed by removing the coating such as the anti-reflective coating in the resist-free areas, by dry etching or the like.

The above-described radiation absorbing polymers wherein a dye is chemically bonded to a skeletal polymer, generally have a low solubility in solvents for resists, and hence solvents different from those used for resists, such as cyclohexanone, are often employed as a solvent for the radiation absorbing polymer. In case that a solvent used for forming a radiation absorbing coating, such as an anti-reflective coating, is different from that for resist, there may arise problems that process steps for forming the anti-reflective coating in manufacturing integrated circuits increase in number and, in some cases, properties of the resist layer themselves are adversely affected. In addition, in the case that the anti-reflective coating and the photoresist layer are formed by using the same coating apparatus and the anti-reflective coating materials are insoluble in the solvent for resist, there arises a problem that the anti-reflective coating material might be precipitated due to the influence of mixing of the resist coating waste and the anti-reflective coating solution. The precipitate thus formed might close up pipes for waste liquor, or might scatter as fine powder, resulting in pattern defects. Further, an additional pipe line for feeding a solvent for washing the backside and periphery of substrate might be required. As is described above, an anti-reflective coating composition containing a low molecular weight dye dispersed in a polymer has also been developed. Such composition, however, often causes unevenness in coating thickness when coated on a surface of a substrate with topography, that is, it provides poor coverage, which should desired to be improved. In addition, in conducting the resist process on a substrate with areas with topography, coating of the resist is, in some cases, difficult or it is difficult to make the thickness of the resist uniform, due to difference in the level of the surface. There is also a requirement on planarization of the substrate surface by a film-forming material to get uniform thickness of the resist coating formed thereon for improving the accuracy of the formed resist pattern, as well as preventing reflection. Thus, it has been desired to provide an anti-reflecting coating material which can provide high performance, which enables one to control coverage properties on a surface of a substrate with topography, which undergoes no change in the properties of the anti-reflective coating upon baking, and which is soluble in a solvent for the resist.

Further, it has eagerly been required to attain higher resolution in the resist process and, therefore, wavelength of radiation for exposing resists is being shifted to shorter wavelengths, and a process of using KrF laser (248 nm) has been put into practice. However, since substrates presently used show high reflectivity for radiation of such short wavelength and since thickness of a resist is being reduced with the enhancement of resolution, a radiation absorbing coating is desired which can well prevent reflection even when used in a thin thickness in view of the dry etching process. Therefore, it is necessary to develop a radiation absorbing material which absorbs well the radiation of the shorter wavelength to be used, which shows no coating defects even when coated in a thin thickness, and which can match with various kinds of resists.

This invention is made to provide a radiation absorbing polymer satisfying these requirements, a composition containing such a radiation absorbing polymer, and a radiation absorbing coating formed by using the composition.

That is, a first object of the present invention is to provide a radiation absorbing polymer which satisfies the above-described various requirements, that is, which shows high solubility in a resist solvent, which can form a radiation absorbing coating such as a conformal anti-reflective coating on a substrate with topography, which, in some cases, can fill up depressions on the surface of a substrate to make it even, which shows a high anti-reflective effect, and which can form a resist pattern with good adhesion to the substrate and a resist layer, good dry etchability, high heat-resistance and excellent resolution.

A second object of this invention is to provide a composition which can form a radiation absorbing coating capable of satisfying the above-described requirements.

A third object of the present invention is to provide a method for forming a radiation absorbing coating capable of satisfying the above-described requirements.

The other object of this invention is to provide a radiation absorbing coating and an anti-reflective coating capable of satisfying the above-described requirements.

DISCLOSURE OF THE INVENTION

As a result of intensive investigations, the inventors have found that a radiation absorbing polymer satisfying the above-described requirements can be obtained by using a monomer having a keto group in its side chain as a recurring unit of the radiation absorbing polymer.

That is, one aspect of the present invention is a radiation absorbing polymer which has absorption at a predetermined wavelength radiation and which contains at least both a recurring unit having a keto group in its side chain and represented by the following general formula (1) and a recurring unit having in its side chain an organic chromophore absorbing a predetermined wavelength radiation and represented by the following formula (2):

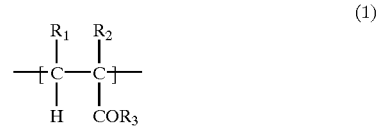

wherein $R_1$ and $R_2$-independently represent a hydrogen atom, an alkyl group or other organic group, and $R_3$ represents an organic group having at least one carbonyl group;

wherein $R_4$ and $R_5$ independently represent a hydrogen atom, an alkyl group, a carboxyl group or other organic group, and Y represents a group having an organic chromophore having an absorption at a predetermined wavelength radiation, said organic chromophore being bonded directly or through a linkage group to the carbon atom constituting the main chain.

Another aspect of the present invention is a composition for radiation absorbing coating containing the above-described radiation absorbing polymer.

A further aspect of the present invention is a method of forming a radiation absorbing coating by applying the composition for radiation absorbing coating on a substrate and baking it.

A still further aspect of the present invention is a radiation absorbing coating and an anti-reflective coating formed according to the above-described method.

The present invention is described in more detail by the following descriptions which, however, should not be construed to limit the scope of the present invention.

First, as is described above, the radiation absorbing polymer of the present invention is a radiation absorbing polymer containing at least both the recurring unit represented by the formula (1) and the recurring unit represented by the formula (2) and absorbing at a predetermined wavelength of radiation. Preferred examples of the recurring unit represented by the formula 1 are those represented by the following formula (3), (4) or (5). In the case that a plurality of keto groups are in the recurring unit represented by the following formula (3), (4) or (5), the radiation absorbing polymer shows improved solubility in solvents usually used for resists, due to the existence of the keto groups and, in case that at least one hydrogen atom is bonded to the methylene group of the recurring unit, there results a hard coating owing to the reaction with a cross linking agent based on the activity of the hydrogen atom.

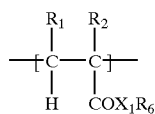
(3)

wherein
$R_1$ and $R_2$ represent independently a hydrogen atom, an alkyl group or other organic group, $R_6$ represents an organic group containing at least one carbonyl group, $X_1$ represents O, S, $NR_7$ or a straight, branched or cyclic alkylene group containing at least one carbon atom, $R_7$ represents a hydrogen atom or a substituted or non-substituted, phenyl or cyclic, straight or branched alkyl group.

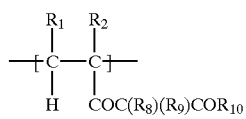
(4)

wherein
$R_1$, $R_2$, $R_8$, $R_9$ and $R_{10}$ represent independently a hydrogen atom, an alkyl group or other organic group.

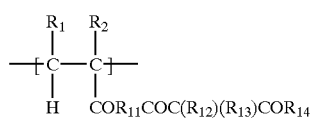
(5)

wherein
$R_1$, $R_2$, $R_{12}$, $R_{13}$ and $R_{14}$ represent independently a hydrogen atom, an alkyl group or other organic group, and $R_{11}$ represents a divalent group.

As monomers for constituting the recurring units represented by the above-described formula 3 or 4, there are specifically illustrated the following ones:

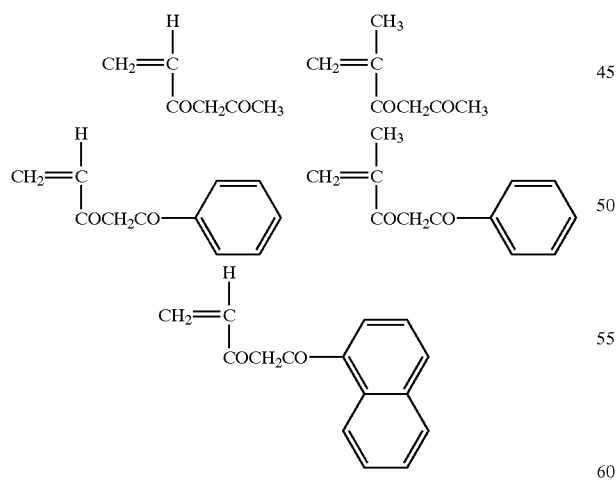

As the recurring unit represented by the above-described formula 5, there are illustrated, for example, those wherein $R_{11}$ represents —$OR_{15}O$— or —$NHR_{15}O$— (wherein $R_{15}$ represents one of substituted or non-substituted, straight, branched or cyclic alkylene groups or a substituted or non-substituted phenylene group), with those wherein $R_{15}$ represents an alkylene group such as an ethylene group. As monomers for constituting the recurring units represented by the above-described formula 3 or 5, there are specifically illustrated the following ones:

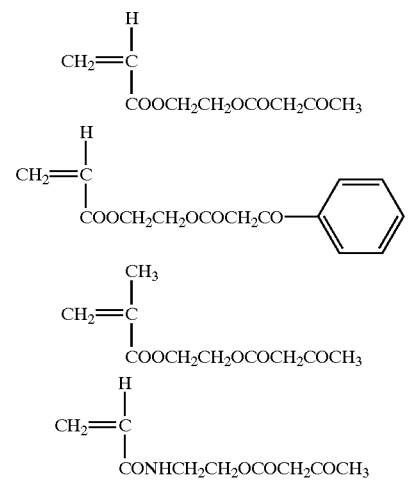

On the other hand, the recurring unit represented by the above formula 2 is more specifically exemplified by those represented by the following formula 6 or 7:

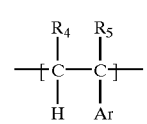
(6)

wherein
$R_4$ and $R_5$ represent independently a hydrogen atom, an alkyl group, a carboxyl group or other organic group, and Ar is a chromophore which absorbs the predetermined wavelength radiation and represents one of substituted or non-substituted benzene ring, condensed ring or heterocyclic ring groups bonded directly or through a linkage group to the main chain carbon atom.

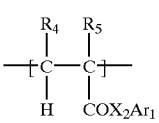
(7)

wherein
$R_4$ and $R_5$ represent independently a hydrogen atom, an alkyl group, a carboxyl group or other organic group, $X_2$ represents O, S, $NR_{16}$ or a straight, branched or cyclic alkylene group containing at least one carbon atom, $R_{16}$ represents a hydrogen atom or a substituted or non-substituted, phenyl group or cyclic, straight or branched alkyl group and $Ar_1$ is a chromophore which has absorption at a predetermined wavelength radiation and represents one of substituted or non-substituted benzene ring, condensed ring or heterocyclic ring groups bonded directly or through a linkage group to $X_2$.

Monomers used for constituting the recurring units represented by the above formula 6 or 7 are exemplified by the following:

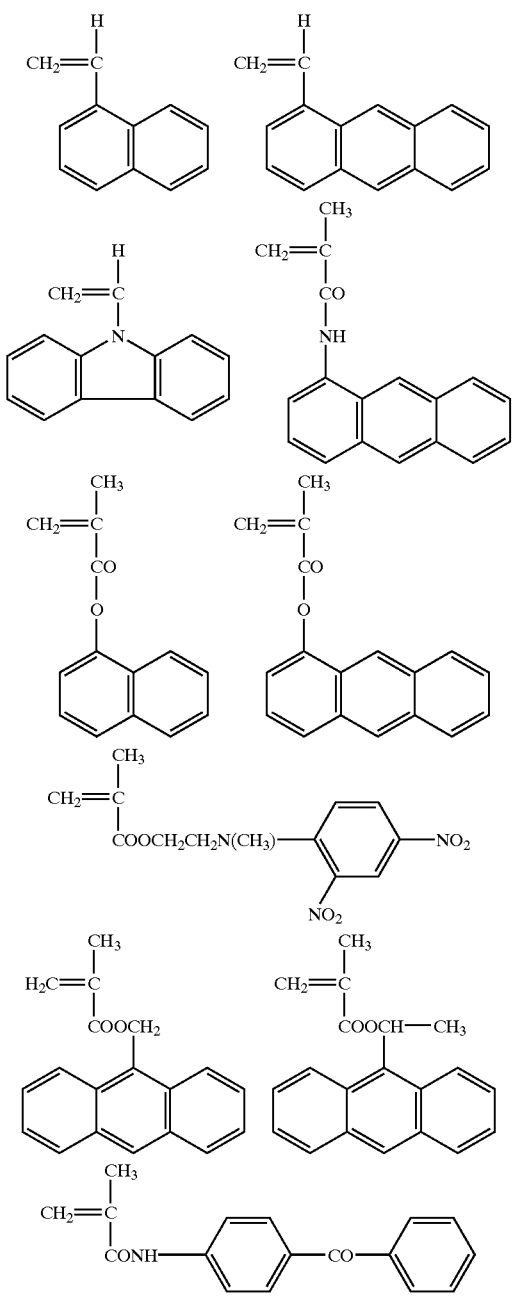

In addition, the radiation absorbing polymer of the present invention may contain other recurring units than those represented by the formulae (1) and (2) in addition to the recurring units represented by the formulae (1) and (2) in order to impart the polymer high radiation absorbing property, high etching rate, good solubility for a particular solvent, good storage stability, cross-linking property (curability) or other preferred properties. As monomers for constituting such other recurring units, usually acrylates or methacrylates are used for imparting solubility to the resulting polymer, and styrenes are used for increasing Tg. Other specific examples of the other comonomers than those for constituting the recurring units of formulae 1 and 2, which can impart preferred properties, include methyl methacrylate, methyl acrylate, 2-hydroxyethyl methacrylate, ethyl methacrylate, 2-(methacryloyloxy)ethyl methacrylate, butyl methacrylate, t-butyl methacrylate, glycidyl methacrylate, methacrylic acid, acrylic acid, acrylonitrile, acrylamide, hydroxymethylacrylamide, 2-isocyanatoethyl methacrylate, 4-acetoxystyrene, 3-methyl-4-hydroxystyrene, styrene, vinyl chloride, ethyl vinyl ether, butyl vinyl ether, isobutyl vinyl ether, cyclohexyl vinyl ether, methyl vinyl ether, maleic anhydride, maleimide, N-substituted maleimide, vinyl acetate, 2-isocyanatoethyl acrylate, etc. Of these, methyl methacrylate, methacrylic acid, methyl acrylate, 2-hydroxyethyl methacrylate, hydroxymethylacrylamide, butyl methacrylate, t-butyl methacrylate, glycidyl methacrylate, methyl vinyl ether, butyl vinyl ether, etc. are preferred.

Main properties to be imparted by these comonomers are illustrated below. In the case of using together with organic chromophore, radiation absorption is more enhanced by using, for example, 2-isocyanatoethyl acrylate, maleic anhydride, maleimide, N-substituted maleimide, 2-isocyanatoethyl methacrylate, etc. as the comonomers, etching rate is increased by using, for example, methyl methacrylate, methyl acrylate, 2-hydroxyethyl methacrylate, ethyl methacrylate, butyl methacrylate, t-butyl methacrylate, acrylic acid, vinyl chloride, etc., solubility for solvents commonly used as solvents for photoresists such as propylene glycol monomethyl ether acetate (PGMEA) or ethyl lactate is improved by using, for example, 2-(methacryloyloxy)ethyl methacrylate, acrylic acid, 4-acetoxystyrene, 3-methyl-4-hydroxystyrene, ethyl vinyl ether, butylvinyl ether, isobutyl vinyl ether, cyclohexylvinyl ether, methyl vinyl ether, vinyl acetate, etc., cross-linking property (curability) is improved by using, for example, 2-isocyanatoethyl acrylate, 2-isocyanatoethyl methacrylate, methacrylic acid, glycidyl methacrylate, hydroxymethylacrylamide, etc., Tg is increased by using, for example, styrene, 3-methyl-4-hydroxystyrene, etc. However, the above-described specific comonomers and properties imparted by them are to be construed as merely illustrative and not limitative at all.

As the monomers constituting the recurring unit having in the side chain thereof an organic chromophore which absorbs a predetermined wavelength radiation, there are illustrated, for example, those wherein a hydroxyl group- or amino group-containing organic chromophore is chemically bonded to the acid anhydride group or a carboxyl group bonded to the main chain.

Molecular weight and proportion of the recurring units of the radiation absorbing polymer in accordance with the present invention can widely be varied but, in the case of using as a material for forming radiation absorbing coating, those which have a molecular weight of from about 1,000 to about 500,000 and contain at least 5 mol %, based on the whole recurring units, of the recurring unit represented by the formula 1 and at least 10 mol % of the recurring unit represented by the formula 2 are preferred. More preferably, each of the recurring units represented by the formulae 1 and 2 are contained in an amount of 15 mol % or more based on the whole recurring units.

The radiation absorbing polymer of the present invention can be used as, for example, a material for bottom anti-reflective coating used in manufacturing integrated circuits by dissolving the polymer in a solvent. In the case of employing ultraviolet or deep ultraviolet ray as an exposure source for manufacturing integrated circuits using the radiation absorbing polymer of the present invention, the polymer preferably has a strong absorption in the wavelength region of from 180 to 450 nm. In order to obtain such a radiation absorbing polymer, proper recurring unit or units are selected from the recurring units represented by the foregoing formula (2) and, if necessary, from the recurring units represented by the formula (1) or from the recurring units other than those represented by the formulae (1) and (2). Use of such properly selected recurring units represented by the formula (2), capable of strongly absorbing radiation of the exposure wavelength, enables the radiation absorbing polymer containing the recurring units to strongly absorb the radiation used for exposure, thereby reflection of the exposure radiation from the substrate is prevented and a defect-free resist pattern is formed.

The composition for radiation absorbing coating of the present invention contains the above-described radiation absorbing polymer and comprises the radiation absorbing polymer and, if necessary, additives dissolved in a proper solvent. As the solvent to be used for the composition of the present invention, any of those that have conventionally been used for forming a coating and can dissolve the radiation absorbing polymer and other additives may be used. As preferred examples of the solvents, there are illustrated γ-butyrolactone, cyclohexanone, dimethylacetamide, dimethylformamide, dimethylsulfoxide, N-methylpyrrolidone, ethyl lactate (EL), methoxy propanol (PGME), propylene glycol monomethyl ether acetate (PGMEA), methyl amyl ketone (MAK) or an optional mixture thereof. Of these, γ-butyrolactone, cyclohexanone, EL, PGME, PGMEA and a mixed solvent of PGME and PGMEA are particularly preferable solvents.

Concentration of the radiation absorbing polymer in the composition can be varied over a wide range depending upon the purpose of use of the composition and the thickness of the radiation absorbing coating. For example, in the case of use as an anti-reflective coating, it is usually 20% by weight or less As the additives to be contained in the composition for radiation absorbing coating of the present invention, there are illustrated, for example, conventionally known radiation absorbing compounds, surfactants or silane series leveling agents for improving adhesion to a substrate and enhancing coating properties, and the like. In addition, in order to enhance cross-linking density upon formation of the coating, commonly known cross-linking agents and cross-linking auxiliaries may be added. As cross-linking agents and cross-linking auxiliaries, there are specifically illustrated melamine compounds, substituted urea compounds, acid-generating agents which can generate acid upon being heated or irradiated to thereby accelerate cross linking, bisblocked isocyanates, blocked isocyanates and epoxy group-containing polymers, etc. These cross-linking agents or auxiliaries may be either low molecular weight compounds or polymers. These cross-linking agents or auxiliaries are desirably added in an amount of 0.1 to 50% by weight based on the weight of the radiation absorbing polymer. In the composition for radiation absorbing coating may also be incorporated, if necessary, low molecular weight compounds or polymers other than the polymer of the present invention.

The radiation absorbing coating of the present invention containing the radiation absorbing polymer may be formed on, for example, a substrate by coating on a substrate a composition for radiation absorbing coating obtained by dissolving the radiation absorbing polymer and, if necessary, desired additives in a proper solvent or, in some cases, by conducting the polymer-forming reaction on the substrate to thereby directly form a coating of the reaction product on the substrate.

The radiation absorbing coating composition is coated on a substrate in a proper thickness depending upon its use. In the case of forming, for example, an anti-reflective coating, it is coated on a substrate in a dry thickness of 300 to 5,000 Å, by spin coating, cast coating, roller coating or the like. After the coating procedure, the coating is baked on a hot plate or in an oven to make it insoluble in a resist solvent. The baking is conducted at a temperature of about 90 to 260° C., preferably 160° C. or above.

A photoresist is applied to the radiation absorbing coating, such as the anti-reflective coating thus formed on the substrate, in a predetermined thickness, then prebaked to form a photoresist layer. As the photoresist, either positive working or negative working photoresists can be used. Typical examples of usable photoresists include a positive working photoresist comprising novolak resin and a quinonediazide type light-sensitive agent, a chemically amplified resist, etc. which, however, are not limitative at all. Solvents for the photoresist include EL, PGME, PGMEA, ketones, etc. Prebaking temperatures vary depending upon the kind of photoresist to be used, but is usually about 30 to about 200° C. The radiation for exposure of the photoresist can be selected from among visible light, UV rays, deep UV rays, KrF eximer laser, argon fluoride (ArF) laser (193 nm), X-rays, electron beams, etc. As the radiation absorbing polymer used in radiation absorbing coating to prevent the reflection from the substrate, those polymers which absorb the radiation of wavelengths required for exposure, as has been described hereinbefore, are selected. After exposure, the photoresist is subjected to development with a developer solution after optionally post-exposure baking, a resist pattern thus being formed. The radiation absorbing coating such as the anti-reflective coating is then dry etched using gas plasma such as oxygen plasma to thereby form a defect-free resist pattern that serves to process or treat the substrate. Additionally, as the developer solution, there may be used known developers such as an alkaline aqueous solution which contains a metal hydroxide, an organic amine or the like dissolved therein.

By selecting the processing conditions, the composition for radiation absorbing coating of the present invention may also be used as a coating which functions to prevent reflection of radiation and to prevent adverse mutual action between the substrate and the resist or to prevent the adverse action of materials used in the resist or substances produced upon exposure of the resist on the substrate. Further, it may be used as a coating for planarizing the surface of the substrate on which a pattern has already been formed (substrate having topography) by fill up depressions on the surface before coating a photoresist thereon to thereby enhance uniformity in the thickness of the coating, such as a photoresist to be coated thereon.

Additionally, in the case of using the radiation absorbing coating of the present invention as a coating which planarizes the substrate surface, it is proposed to slightly reduce the glass transition temperature (Tg) of the radiation absorbing polymer to cause some flow upon baking and, after being completely solidified, make the coating insoluble in resist solvents. The slight reduction in Tg may be attained, for example, by slightly reducing the cross-linking ability of the radiation absorbing polymer upon being heated. In order to impart to the polymer the function flat XXXX the surface of the substrate, there are various techniques of, for example, properly selecting this degree of polymerization of the radiation absorbing polymer, concentration of the radiation absorbing polymer in the composition or substituents in the recurring units represented by the formula (1) or (2) and properly selecting the proportion of the recurring units represented by the formulae (1) and (2) in the polymer and a type of comonomer other than those represented by the formula (1) or (2), or properly selecting the type of additives.

The coating composition for radiation absorbing of the present invention is soluble in a solvent for a photoresist. Therefore, it enables one to use the same coating apparatus, the same waste liquor apparatus and the same rinsing solution as those used for the resist. In addition, the anti-reflective coating using the radiation absorbing polymer of the present invention which shows a high absorption of DUV (248 nm) can preferably be used as an anti-reflective coating for chemically amplified resists sensitive to DUV. Further, the radiation absorbing coating of the present invention has such a low dependence upon resists that anti-reflective coating materials are not required to be changed when resists are changed in the manufacture of IC, and therefore, no process changes have to be evalusted, which is extremely advantageous for users. For example, AZ®-BARLi® coating manufactured by Clariant Corp., a commercially available anti-reflective coating material, designed for i-line (365 nm) exposure is very soluble in cyclohexanone, but is barely soluble in a resist solvent and has, therefore, the defect that used the same coating apparatus as that for coating resist is difficultly used upon applying the anti-reflective coating composition or upon edge rinsing. In addition, though AZ®-BARLi® coating itself absorbs DUV, it has such a resist dependence that, in some cases, footing or undercut is observed in the profile of a resulting resist pattern. The radiation absorbing polymer of the present invention also has the feature that, while it is soluble in a resist solvent, it forms a film insoluble in the resist solvent and, is also, insoluble in an aqueous alkaline developer solution for resists, due to being heated at a proper temperature after coating on a substrate. Therefore, the radiation absorbing coating such as the anti-reflective coating of the present invention never suffers dissolution when a photoresist coating composition Is coated thereon or when wet a development processing is conducted after exposure. Still further, the radiation absorbing coating of the present invention has the feature that, when a resist pattern is used as an etching mask, it can easily be removed by dry etching.

Additionally, the radiation absorbing polymer of the present invention may be obtained according to various known synthesizing processes. For example, there is illustrated a process of copolymerizing a monomer having a keto group in the side chain and corresponding to the recurring unit represented by the foregoing formula (1) with a monomer having an organic chromophore and corresponding to the recurring unit represented by the foregoing formula (2). The monomer having an organic chromophore may easily be obtained by known synthesis processes, for example, by converting a hydroxyl group- or amino group-containing organic chromophore compound to its acrylate or acrylamide. As the process for obtaining the radiation absorbing polymer, the above-described copolymerization process is the most popular. However, it is also possible to introduce a radiation absorbing group into a polymer by the reaction between a polymer having a reactive group and an organic chromophore compound having a hydroxyl group, an amino group, or the like.

In the present invention, polymerization may be conducted in a proper solvent using a free radical or ionic reaction initiator. The resulting copolymer may be of various structures such as a random copolymer or a block copolymer. As preferred solvents for the polymerization, there are illustrated toluene, tetrahydrofuran, benzene, dimethylformamide, dimethylsulfoxide, ethyl lactate, propylene glycol monomethyl-ether acetate (PGMEA), cyclopentanone, cyclohexanone, butyrolactone, 2-heptanone, ethyl-3-ethoxypropanate, ethylene glycol monoethyl acetate, methyl-3-methoxypropanate, etc. These solvents may be used alone or in combination of two or more of them.

As specific examples of the reaction initiators, there are illustrated 2,2'-azobis(isobutyronitrile)(AIBN), 2,2'-azobis(4-methoxy-2,4-dimethylvaleronitrile), 2,2'-azobis(2-cyclopropylpropionitrile), 2,2'-azobis(2,4-dimethyl valeronitrile), 2,2'-azobis(2,4-dimethylpentanenitrile), 1,1'-azobis(cyclohexanecarbonitrile), benzoyl peroxide, t-butyl peroxy benzoate, di-t-butyl diperoxy phthalate, t-butyl peroxy-2-ethyl hexanoate, t-butyl peroxy pivalate, t-amyl peroxy pivalate, butyl lithium, etc. However, initiators are not limited only to these.

These polymers may be separated from the solvent, then again dissolved in a proper solvent to prepare an anti-reflective coating composition or a composition for radiation absorbing coating or, if the solvent used in the synthesis reaction can be utilized as a solvent for the anti-reflection coating composition or composition for radiation absorbing coating, it may directly be used as the anti-reflective coating composition or composition for radiation absorbing coating without separating the polymer, or the reaction solution may directly be applied to a substrate such as a wafer after completion of the reaction. Additionally, the anti-reflective coating composition or composition for radiation absorbing coating is desirably subjected to filtration using, for example, using a 0.5, 0.2 or 0.1 micron ($\mu$m) filter to thereby remove insoluble fine particles. The filtered solution may directly be applied to a substrate such as a wafer.

Molecular weight of the thus obtained polymer varies depending upon polymerization time, reaction temperature, concentrations of used monomers and initiators, kind of reaction medium, etc. and can easily be controlled by properly selecting these parameters. Polymers having a narrow molecular weight distribution may be obtained by employing ionic polymerization.

Molar ration of the comonomers in the radiation absorbing polymer is decided based on reaction rate of each monomer and employed reaction conditions. The radiation absorption and refractive index of final polymer to a desired wavelength radiation is quite important in determining whether the polymer can be used as a bottom anti-reflective coating or the like or not. Radiation absorption of the coating is preferably in the range of from 2 to 40 per micron in thickness, with 5 to 25 being more preferred. Copolymers composed of three or more types of comonomers also required to provide such absorption. Too strong or too weak absorption fails to provide favorable results as an anti-reflective coating. Radiation absorbing properties required for anti-reflective coating materials also depend upon radiation absorbing properties and refractive index of the photoresist material to be coated thereon. Most preferably, the refractive index of the anti-reflective coating is the same as that of the photoresist layer to be coated thereon and, if not, the two indexes are preferably as close as possible to each other. Since radiation absorbing properties of the anti-reflective coating materials are determined by the radiation absorbing properties and molar ratio of the chromophore-containing monomer, the proportion of the chromophore-containing monomer in mol % is important for the anti-reflective coating material. In the present invention, this proportion can easily be controlled by adjusting the charging proportion of the chromophore-containing monomer, and a polymer with the desired values can be prepared.

BEST MODE FOR PRACTICING THE INVENTION

The present invention is now described in more details by reference to the following Examples. These examples, however, are only illustrative to explain the present invention and are not intended to limit the scope of the present invention.

SYNTHESIS EXAMPLE 1

Synthesis of 9-Methacryloyloxymethylanthracene 87.5 g (0.42 mol) of 9-hydroxymethylanthracene was added to 500 ml of ethyl acetate at room temperature. To this was further added 7.3 g (60 millimols) of 4-dimethylaminopyridine under stirring, and 83 g (0.54 mol) of methacrylic anhydride was dropwise added thereto. Thereafter, the reaction mixture solution was stirred at 60° C. for about 4 hours until the reaction was completed. After completion of the reaction, the reaction product was cooled to room temperature, and ethyl acetate was added thereto. The organic layer was washed with, successively, an alkaline water and water, then subjected to distillation under reduced pressure to remove the organic solvent and obtain a solid end product. Yield was 80 g (73%). This product was identified by measurement of the UV absorption in methanol and NMR. The UV absorption measurement revealed that the molar extinction coefficient at 248 nm was $1.05 \times 10^5$. $^1$H-NMR(DMSO-d6), (400 MHz) measurement showed signals at 1.82(s,3H), 5.59(s,1H), 5.9(s,1H), 6.2(s,2H), 7.49–7.7(m,4H), 8.12(m,2H), 8.4(m,2H) and 8.67(s,1H).

SYNTHESIS EXAMPLE 2

Synthesis of 1-Methacryloylaminoanthracene 25 g (0.13 mol) of 1-aminoanthracene was dissolved in 120 ml of ethyl acetate at room temperature. To this solution was added 0.61 g (5 millimols) of 4-dimethylaminopyridine and, under stirring, a mixed solution of 24.6 g (0.16 mol) of methacrylic acid anhydride and 30 ml of ethyl acetate was added dropwise thereto over about 5 minutes. Thereafter, the reaction mixture solution was stirred at 50° C. for 3 hours, then cooled to room temperature, followed by collecting the precipitate formed by filtration. The precipitate was washed twice with ethyl acetate, then dried under vacuum to obtain the end product of 1-methacryloylaminoanthracene. Yield was 18.6 g (60%). Further, about 9 g of the end product was obtained from the filtrate. Measurement of the U absorption in methanol revealed that molar extinction coefficient at 248 nm was $4.1 \times 10^4$.

EXAMPLE 1

55.2 g (0.2 mol) of 9-methacryloyloxymethylanthracene and 42.8 g (0.2 mol) of acetylacetoxyethyl methacrylate were dissolved in 500 ml of tetrahydrofuran (THF), and 3.28 g (20 millimols) of azobisisobutyronitrile (AIBN) was added thereto as a radical initiator. Then, the mixture was stirred at room temperature for 15 minutes while introducing thereinto nitrogen, followed by heating the reaction mixture solution at a reflux temperature for 10 hours. Thereafter, the reaction solution was cooled to room temperature, then poured into isopropanol (IPA) to form a precipitate. The precipitate was collected by filtration, washed with IPA, and dried in vacuo at 50° C. to obtain a polymer (hereinafter referred to as "polymer A"). Yield was 78 g (82%). $^1$H-NMR(DMSO-d6) measurement revealed the presence of a proton on the aromatic ring or anthracene (6.5–8.3 ppm) and a methylene proton bound to anthracene (5.2–6.3 ppm). Further, the integral ratio of proton of ethyl derived from acetylacetoxyethyl methacrylate (—OCH$_2$CH$_2$O—, 3–4 ppm) revealed that the molar ratio of 9-methacryloyloxymethylanthracene monomer to acetylacetoxyethyl methacrylate in the polymer was about 1.06:1. GPC analysis using dimethylformamide as a mobile phase and polyethylene oxide as a standard substance revealed that polymer A had a weight average molecular weight, Mw, of 17,000, a number average molecular weight, Mn, of 8,430, and degree of dispersion, Mw/Mn, of 2.03. Separately, polymer A was dissolved in PGMEA in a concentration capable of being coated on a silicon wafer in a thickness of about 100 nm by spin coating, coated on a silicon wafer, and baked at 200° C. for 60 seconds. The optical absorption coefficient (k value) at 248 nm of the thus formed coating was measured as 0.58, using a spectral ellipsometer. When polymer A was mixed with PGMEA in a proportion of 10 wt % and stirred at room temperature, the polymer was completely dissolved.

EXAMPLE 2

Polymers were synthesized in the same manner as in Example 1 except for changing charging the ratio of 9-methacryloyloxymethylanthracene (MAOMA) and acetylacetoxyethyl methacrylate (AAEM) to the values described in synthesis numbers 1 and 2 shown in Table 1. Copolymerization ratios (molar ratio) of MAOMA to AAEM of the thus obtained polymers were measured and confirmed. The optical absorption coefficients k of the polymer coating at 248 nm were measured using a spectral ellipsometer. Results of the measurements are shown in Table 1. Further, elution tests revealed that every polymer was readily soluble in a resist solvent such as PGMEA. From these results, it is seen that the present invention can provide polymers showing a high absorption and being soluble in a resist solvent with a good reproducibility.

TABLE 1

| Synthesis No. | molar ratio of monomer MAOMA:AAEM | molar ratio in polymer based on NMR spectrum MAOMA:AAEM | value of k (248 nm) |
| --- | --- | --- | --- |
| 1 | 0.5:1 | 0.55:1 | 0.48 |
| 2 | 0.6:1 | 0.5:1 | 0.51 |
| 3-1 (Example 1) | 1:1 | 1.06:1 | 0.58 |
| 3-2 (repeat of Example 1) | 1:1 | 1.1:1 | 0.59 |

EXAMPLE 3

52.2 g (0.2 mol) of 1-methacryloylaminoanthracene and 42.8 g (0.2 mol) of acetylacetoxyethyl methacrylate were dissolved in 500 ml of tetrahydrofuran (THF) at room temperature, and 3.28 g (20 millimols) of azobisisobutyronitrile (AIBN) was added thereto as a radical initiator. Then, the mixture was stirred at room temperature for 15 minutes while introducing thereinto nitrogen, followed by heating the reaction mixture solution at a reflux temperature for 10 hours. Thereafter, the reaction solution was cooled to room temperature, then poured into isopropanol (IPA) to form a precipitate. The precipitate was collected by filtration, washed with IPA, and dried in vacuo at 50° C. to obtain a polymer. Yield was 82 g (89%). The integral ratio of proton in the anthracene moiety to proton of ethyl derived from acetylacetoxyethyl methacrylate (—OCH$_2$CH$_2$O—) by $^1$H-NMR(DMSO-d6) measurement revealed that the molar ratio of the two monomers in the polymer was about 1:1. GPC analysis using dimethylformamide as a mobile phase and polyethylene oxide as a standard substance revealed that the obtained polymer had a weight average molecular weight, Mw, of 35,000, a number average molecular weight, Mn, of 15,200, and degree of dispersion, Mw/Mn, of 2.3. Separately, this polymer was formed into a coating by baking at 200° C. for 60 seconds. The optical absorption coefficient, k at 248 nm of the thus formed coating was measured as 0.4 using a spectral ellipsometer.

EXAMPLE 4

41.4 g (0.15 mol) of MAOMA, 32.1 g (0.15 mol) of AAEM and 15 g (0.15 mol) of methyl methacrylate were dissolved in 500 ml of tetrahydrofuran (THF) at room temperature, and 3.28 g (20 millimols) of azobisisobutyronitrile (AIBN) was added thereto as a radical initiator. Then, the mixture was stirred at room temperature for 15 minutes while introducing thereinto nitrogen, followed by heating the reaction mixture solution at a reflux temperature for 10 hours. Thereafter, the reaction solution was cooled to room temperature, then poured into isopropanol (IPA) to form a precipitate. The precipitate was collected by filtration, washed with IPA, and dried in vacuo at 50° C. to obtain a polymer (hereinafter referred to as "polymer B"). Yield was 68.8 g (80%). GPC analysis using dimethylformamide as a mobile phase and polyethylene oxide as a standard substance revealed that the obtained polymer had a weight average molecular weight, Mw, of 30,000, a number average molecular weight, Mn, of 14,300, and degree of dispersion, Mw/Mn, of 2.1. Separately, this polymer was formed into a coating by baking at 200° C. for 60 seconds. The optical absorption coefficient k at 248 nm of the thus formed coating was measured as 0.53 using a spectral ellipsometer. Results of elution test showed that the polymer had a high solubility in resist solvents such as PGMEA, PGME and EL.

EXAMPLE 5

Preparation of radiation absorbing composition 6 g of the polymer A obtained in Example 1 was dissolved in 100 g of PGMEA at room temperature with stirring and, after the polymer was completely dissolved, this solution was filtered through a 0.1-micron filter to obtain composition C for radiation absorbing coating. Separately, in this composition C for radiation absorbing coating were dissolved hexamethoxymethylmelamine (20 wt % based on polymer A) and 2,4-bistrichloromethyl-6-styryl-s-triazine (2 wt % based on polymer A), and the resulting solution was filtered through a 0.1-micron filter to obtain composition D for radiation absorbing coating.

Further, 5 g of polymer B obtained in Example 4 was dissolved in 100 g of PGMEA at room temperature with stirring, and this solution was mixed with 15 wt % based on the polymer of CORONATE® 2507 (blocked bisisocyanate; manufactured by Nippon Polyurethane K.K.) and, after stirring for a while, the mixture was filtered through a 0.1-micron filter to obtain composition E for radiation absorbing coating.

COMPARATIVE EXAMPLE 1

AZ®-BARLi® solution for forming an anti-reflective coating sold by Clariant Corp. was coated on to a 4-inch silicon wafer by spin coating under proper conditions. The thus obtained sample was used for the following experiments for comparison.

EXAMPLE 6

The compositions C, D and E for radiation absorbing coating prepared in Example 5 were respectively spin coated on to a 4-inch silicon wafers under proper conditions. The thus obtained samples were used in the following experiments for comparison.

EXAMPLE 7

Experiment for Comparing Rinsing Property Before Baking

The rinsing properties of the radiation absorbing coating were examined by dropping a rinsing solution (PGME:PGMEA=70:30 (by weight)) for 10 seconds, 20 seconds or 30 seconds onto a non-baked composition for radiation absorbing coating placed on a silicon wafer on a spin coater rotating at 800 rpm. As a result, it was found that radiation absorbing coatings formed from the compositions C, D and E for radiation absorbing coating of the present invention were completely removed by the 10-second rinsing, whereas a comparative film of AZ®-BARLi® coating prepared by a comparative examination 1 was removed only partly even with a 30-second rinsing.

EXAMPLE 8

Experiments for Comparing Coverage

A resist pattern was previously formed on a silicon wafer, baked at a high temperature of about 250° C. to make the resist pattern insoluble in a resist solvent, and platinum was vapor deposited thereon to prevent adverse mutual action between the resist pattern and the composition for radiation absorbing coating and to facilitate observation under a scanning electron microscope (SEM). Thereafter, each of the compositions C, D and E for radiation absorbing coating prepared in Example 5 was coated onto the silicon wafer having a difference in surface level. On the other hand, AZ®-BARLi® coating manufactured by Clariant Corp. was similarly coated for comparison. These samples were baked on a hot plate at 100° C. for 90 seconds, then cross sections of the patterns were observed under the scanning electron microscope (SEM). As a result, it was found that films obtained from the radiation absorbing polymers of the present invention were formed along the pattern form, thus showing the same coverage property as AZ®-BARLi® film.

It was also found that some of the compositions for radiation absorbing coating obtained from polymers having Tg value lowered by changing the monomer ratio can be coated and fill the depressions of the patterned surface, by baking at a proper temperature of, for example, lower than the cross linking temperature to fluidize the polymer layer, then raising the baking temperature so as to cross link the polymer. Such coating can generally be used as a leveling coating.

EXAMPLE 9

Experiment of Dissolution of Baked Anti-reflective Coating Into a Resist Solvent The composition E for radiation absorbing coating of the present invention was coated onto a silicon wafer at a in dry thickness of 1000 Å, and was baked at a temperature of 180° C., 200° C. or 220° C. A resist solvent of EL, PGMEA or MAK was dropped onto the baked coatings and, after two minutes, the dropped solvent was wiped off to measure the amount of coating removed. Results thus obtained are shown in Table 2. It is seen from the results shown in Table 2 that the radiation absorbing coating of the present invention formed by using the radiation absorbing polymer soluble in the resist solvents and baking at a suitable temperature does not undergo change of the coating itself, such as being dissolved in a resist composition, when a photoresist is formed thereon. In addition, when a developer solution (2.38 wt % aqueous solution of tetramethylammonium hydroxide) was dropped onto each of the coatings to measure the amount of removed coating in the same manner as described above, there were obtained similarly excellent results.

TABLE 2

| | Baking temperature | | |
|---|---|---|---|
| | 180° C. | 200° C. | 220° C. |
| E L | 570 Å | 70 Å | 5 Å |
| PGMEA | 1050 Å | 60 Å | −1 Å |
| MAK | 670 Å | 35 Å | −1 Å |

EXAMPLE 10

Experiments of Testing Resist Pattern

Each of the radiation coating compositions D and E of the present invention was coated onto a silicon wafer at a dry thickness of about 600 Å, and baked at 220° C. for 60 seconds to form anti-reflective coatings. Then, AZ® DX1100P, resist for DUV manufactured by Clariant Japan. was coated thereon in a thickness of 0.75 micron, pattern-wise exposed and developed under predetermined conditions to form a resist pattern on each of the anti-reflective coatings. For comparison, a resist pattern was formed in the same manner on an anti-reflective coating composed of AZ®-BARLi® coating at a in thickness of 1200 Å. Observation of the cross section of each of the thus obtained resist patterns under SEM revealed that the resist patterns formed by using the anti-reflective coatings of the present invention had higher resolution than that of AZ®-BARLi® film, no footing and no undercut. On the other hand, the resist pattern formed by using AZ®-BARLi® coating showed footing. The footing phenomenon may be attributed to adverse mutual action between an acid generated in the exposed areas and the AZ®-BARLi® anti-reflective coating.

Pattern tests conducted by using other DUV photoresists on the reflective coatings of the present invention demonstrated good results.

EXAMPLE 11

Experiment of Comparing Etchability

Anti-reflective coating films obtained from the radiation absorbing composition of the present invention and an anti-reflective coating film obtained from AZ®-BARLi® coating were formed in the same thickness from each other, baked at 220° C., and subjected to an etching test using a dry etching apparatus. As a result of comparing the etch rate of each coating film, it was found that the polymer films of the present invention were etched at about the same etching rate as the AZ®-BARLi® film, with some of the polymer films of the present invention being etched at somewhat faster rate than the film of AZ®-BARLi® film.

Effect of the Invention

As has been described hereinbefore, the radiation absorbing polymer of the present invention which contains a dye moiety having an absorption at a proper wavelength shows a good radiation absorption for a radiation of the wavelength, enables one to form an anti-reflective coating with a good adhesion and, since it is soluble in a solvent to be used as a resist solvent, the same coating apparatus, the same waste liquor apparatus, and the same rinsing solution can be used as those for photoresists in practicing the resist process, thus unnecessary processes or equipment being eliminated.

In addition, the radiation absorbing polymer of the present invention can easily be formed into a film, and can be made insoluble in resist solvents by heating at a proper temperature after being coated. Hence, it enables one to form a radiation absorbing coating such as an anti-reflective coating which is not dissolved in a resist composition or a developer solution for resist during formation of a photoresist layer or during development processing and which can be easily removed by dry etching, thus being well adapted for the resist process.

Further, in the case of coating the composition for radiation absorbing coating of the present invention on a substrate with topography, the composition shows such good coverage that a mask pattern with high resolution can be formed on the substrate with topography. Still further, in the resist process, it is sometimes required to improve the process latitude of the resist by planarization of a substrate. The composition for radiation absorbing coating of the present invention can level the uneven surface using copolymers obtained by properly adjusting the copolymerization ratio of copolymers, selection of the kinds of comonomer, constitution, baking temperature, etc., thus being capable of finding a wide application.

Still further, even in the case of using DUV photoresists posing severe requirements on a substrate, the anti-reflective coating can be used as one for plural DUV photoresists due to the low dependence of the radiation absorbing coating of the present invention.

Industrial Applicability

As has been described hereinbefore, the radiation absorbing polymer and the composition for radiation absorbing coating of the present invention are preferably used as a material for forming a radiation absorbing coating, particularly an anti-reflective coating, in manufacturing integrated circuit elements.

What is claimed is:

1. A radiation absorbing polymer which absorbs a predetermined wavelength radiation and which contains at least both a recurring unit represented by the following formula (1) and a recurring unit represented by the following formula (2):

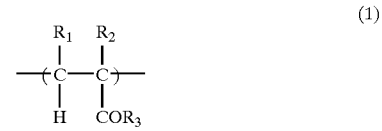

wherein $R_1$ and $R_2$ independently represent a hydrogen atom or an alkyl group, and $R_3$ represents an organic group having at least one carbonyl group;

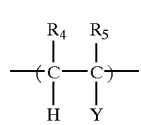

(2)

wherein $R_4$ and $R_5$ independently represent a hydrogen atom, an alkyl group or a carboxyl group, and Y represents a group having an organic chromophore having an absorption at a predetermined wavelength radiation, said organic chromophore being bonded directly or through a linkage group to the carbon atom constituting the main chain, wherein said recurring unit represented by the formula (1) is a recurring unit represented by (a) the following formula (4):

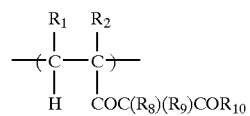

(4)

wherein $R_1$, $R_2$, $R_8$, $R_9$ and $R_{10}$ represent independently a hydrogen atom or an alkyl group, or (b) the following formula (5):

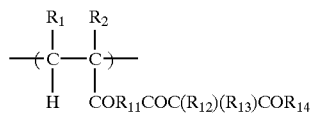

(5)

wherein $R_1$, $R_2$, $R_{12}$, $R_{13}$ and $R_{14}$ represent independently a hydrogen atom or an alkyl group, and $R_{11}$ represents a divalent group.

2. The radiation absorbing polymer described in claim 1 which absorbs a predetermined wavelength radiation, wherein $R_{11}$ in formula (5) represents —$OR_{15}O$— group, wherein $R_{15}$ represents one of substituted or non-substituted, straight, branched or cyclic alkylene groups or a substituted or non-substituted phenylene group.

3. The radiation absorbing polymer described in claim 2 which absorbs a predetermined wavelength radiation, wherein $R_{15}$ represents an ethylene group.

4. The radiation absorbing polymer described in claim 1 which absorbs a predetermined wavelength radiation, wherein $R_{11}$ in formula (5) represents —$NHR_{15}O$— group, wherein $R_{15}$ represents one of substituted or non-substituted, straight, branched or cyclic alkylene groups or a substituted or non-substituted phenylene group.

5. The radiation absorbing polymer described in claim 4 which absorbs a predetermined wavelength radiation, wherein $R_{15}$ represents an ethylene group.

6. The radiation absorbing polymer described in claim 1 which absorbs a predetermined wavelength radiation, wherein said recurring unit represented by the formula (2) is a recurring unit represented by the following formula (6):

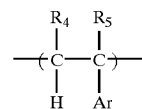

(6)

wherein $R_4$ and $R_5$ represent independently a hydrogen atom, an alkyl group or a carboxyl group, and Ar is a chromophore which has absorption at a predetermined wavelength radiation and represents one of substituted or non-substituted benzene ring, condensed ring or heterocyclic ring groups bonded directly or through a linkage group to carbon atom constituting the main chain.

7. The radiation absorbing polymer described in claim 1, wherein said recurring unit represented by the formula (2) is a recurring unit represented by the following formula (7):

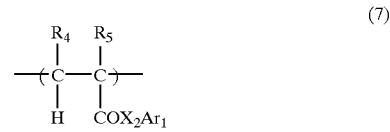

(7)

wherein $R_4$ and $R_5$ represent independently a hydrogen atom, an alkyl group or a carboxyl group, $X_2$ represents O, S, $NR_{16}$ or a straight, branched or cyclic alkylene group containing at least one carbon atom, $R_{16}$ represents a hydrogen atom or a substituted or non-substituted, phenyl group or cyclic, straight or branched alkyl group and $Ar_1$ is a chromophore which has absorption at a predetermined wavelength radiation and represents one of substituted or non-substituted benzene ring, condensed ring or heteroyclic ring groups bonded directly or through a linkage group to $X_2$.

8. The radiation absorbing polymer described in claim 2 which absorbs a predetermined wavelength radiation, wherein said recurring unit represented by the formula (2) is a recurring unit represented by the following formula (6):

(6)

wherein $R_4$ and $R_5$ represent independently a hydrogen atom, an alkyl group or a carboxyl group, and Ar is a chromophore which has absorption at a predetermined wavelength radiation and represents one of substituted or non-substituted benzene ring, condensed ring or heterocyclic ring groups bonded directly or through a linkage group to carbon atom constituting the main chain.

9. The radiation absorbing polymer described in claim 3 which absorbs a predetermined wavelength radiation, wherein said recurring unit represented by the formula (2) is a recurring unit represented by the following formula (6):

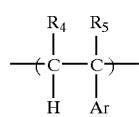

wherein $R_4$ and $R_5$ represent independently a hydrogen atom, an alkyl group or a carboxyl group, and Ar is a chromophore which has absorption at a predetermined wavelength radiation and represents one of substituted or non-substituted benzene ring, condensed ring or heterocyclic ring groups bonded directly or through a linkage group to carbon atom constituting the main chain.

10. The radiation absorbing polymer described in claim 4 which absorbs a predetermined wavelength radiation, wherein said recurring unit represented by the formula (2) is a recurring unit represented by the following formula (6):

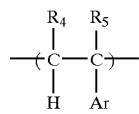

wherein $R_4$ and $R_5$ represent independently a hydrogen atom, an alkyl group or a carboxyl group, and Ar is a chromophore which has absorption at a predetermined wavelength radiation and represents one of substituted or non-substituted benzene ring, condensed ring or heterocyclic ring groups bonded directly or through a linkage group to carbon atom constituting the main chain.

11. The radiation absorbing polymer described in claim 5 which absorbs a predetermined wavelength radiation, wherein said recurring unit represented by the formula (2) is a recurring unit represented by the following formula (6):

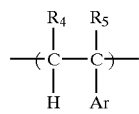

wherein $R_4$ and $R_5$ represent independently a hydrogen atom, an alkyl group or a carboxyl group, and Ar is a chromophore which has absorption at a predetermined wavelength radiation and represents one of substituted or non-substituted benzene ring, condensed ring or heterocyclic ring groups bonded directly or through a linkage group to carbon atom constituting the main chain.

12. The radiation absorbing polymer described in claim 2, wherein said recurring unit represented by the formula (2) is a recurring unit represented by the following formula (7):

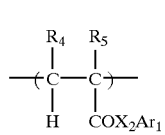

wherein $R_4$ and $R_5$ represent independently a hydrogen atom, an alkyl group or a carboxyl group, $X_2$ represents O, S, $NR_{16}$ or a straight, branched or cyclic alkylene group containing at least one carbon atom, $R_{16}$ represents a hydrogen atom or a substituted or non-substituted, phenyl group or cyclic, straight or branched alkyl group and $Ar_1$ is a chromophore which has absorption at a predetermined wavelength radiation and represents one of substituted or non-substituted benzene ring, condensed ring or heterocyclic ring groups bonded directly or through a linkage group to $X_2$.

13. The radiation absorbing polymer described in claim 3, wherein said recurring unit represented by the formula (2) is a recurring unit represented by the following formula (7):

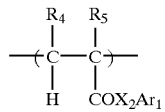

wherein $R_4$ and $R_5$ represent independently a hydrogen atom, an alkyl group or a carboxyl group, $X_2$ represents O, S, $NR_{16}$ or a straight, branched or cyclic alkylene group containing at least one carbon atom, $R_{16}$ represents a hydrogen atom or a substituted or non-substituted, phenyl group or cyclic, straight or branched alkyl group and $Ar_1$ is a chromophore which has absorption at a predetermined wavelength radiation and represents one of substituted or non-substituted benzene ring, condensed ring or heterocyclic ring groups bonded directly or through a linkage group to $X_2$.

14. The radiation absorbing polymer described in claim 4, wherein said recurring unit represented by the formula (2) is a recurring unit represented by the following formula (7):

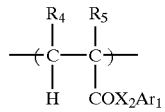

wherein $R_4$ and $R_5$ represent independently a hydrogen atom, an alkyl group or a carboxyl group, $X_2$ represents O, S, $NR_{16}$ or a straight, branched or cyclic alkylene group containing at least one carbon atom, $R_{16}$ represents a hydrogen atom or a substituted or non-substituted, phenyl group or cyclic, straight or branched alkyl group and $Ar_1$ is a chromophore which has absorption at a predetermined wavelength radiation and represents one of substituted or non-substituted benzene ring, condensed ring or heterocyclic ring groups bonded directly or through a linkage group to $X_2$.

15. The radiation absorbing polymer described in claim 5, wherein said recurring unit represented by the formula (2) is a recurring unit represented by the following formula (7):

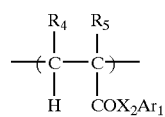

(7)

wherein

R₄ and R₅ represent independently a hydrogen atom, an alkyl group or a carboxyl group, $X_2$ represents O, S, $NR_{16}$ or a straight, branched or cyclic alkylene group containing at least one carbon atom, $R_{16}$ represents a hydrogen atom or a substituted or non-substituted, phenyl group or cyclic, straight or branched alkyl group and $Ar_1$ is a chromophore which has absorption at a predetermined wavelength radiation and represents one of substituted or non-substituted benzene ring, condensed ring or heterocyclic ring groups bonded directly or through a linkage group to $X_2$.

* * * * *